United States Patent

Jones

[11] Patent Number: 5,949,286
[45] Date of Patent: Sep. 7, 1999

[54] LINEAR HIGH FREQUENCY VARIABLE GAIN AMPLIFIER

[75] Inventor: Mark Alan Jones, Forest, Va.

[73] Assignee: Ericsson Inc., Research Triangle Park, N.C.

[21] Appl. No.: 08/938,876

[22] Filed: Sep. 26, 1997

[51] Int. Cl.$^6$ .......................................... H03F 3/45
[52] U.S. Cl. ................................ 330/254; 330/283
[58] Field of Search ............................ 330/254, 283, 330/149; 327/359

[56] References Cited

FOREIGN PATENT DOCUMENTS

| 18658 | 2/1979 | Japan | 330/254 |
|---|---|---|---|
| 84513 | 5/1983 | Japan | 330/254 |
| 161513 | 9/1983 | Japan | 330/254 |
| 114313 | 5/1987 | Japan | 330/254 |

OTHER PUBLICATIONS

Liu, "Differential Variable–Gain Amplifier", IBM Technical Disclosure Bulletin, vol. 15, No. 5, Oct. 1972.

Primary Examiner—Robert Pascal
Assistant Examiner—Khanh Van Nguyen
Attorney, Agent, or Firm—Jenkens & Gilchrist, P.C.

[57] ABSTRACT

A linear, high frequency, variable gain amplifier is disclosed. The amplifier includes a differential amplifier transistor pair for providing a gain controlled output signal in response to an input signal. Diode pairs connected between the emitters of the transistors, in conjunction with transistor gain control circuitry, provide for gain control of the output signal. A dummy amplifier connected to the differential amplifier transistor pair cancels the capacitance effects created by the diode pair.

14 Claims, 2 Drawing Sheets

LINEAR HIGH FREQUENCY VARIABLE GAIN AMPLIFIER

DESCRIPTION OF RELATED ART

Variable gain amplifiers (VGAS) are used in transceiver applications where a signal level must be adjusted. Examples of this include signal level adjustment within the power control loop of a transmitter or within a signal level equalizer of a receiver. Existing VGAs typically suffer from two drawbacks which limit their use. First, existing variable gain amplifiers exhibit excessive levels of intermodulation distortion, and second, VGAs tend to lose gain control range at high frequencies such that their effective operation range is limited to frequencies of 100 MHz or below.

There exists a variety of different types of VGAs that are used in countless designs. Most of these variable gain amplifiers fall within one of three categories. The Gilbert Cell Multiplier, as illustrated in FIG. 1, is a circuit used widely as a mixer or a variable gain amplifier block. When used as a variable gain amplifier block, the input signal is applied to the lower differential pair 10 and the control signal is applied to the upper differential pair 15. Gain control is achieved by steering the signal current between the devices, thus creating signal cancellation to reduce the gain. The reliance of the Gilbert cell multiplier on active signal cancellation causes the gain control range to be directly limited by device mismatches. Thus, the frequency range over which a high level of gain control is possible is limited.

The Two Quadrant Multiplier Variable Gain Amplifier of FIG. 2 multiplies a voltage by a current. The two quadrant multiplier uses a variable current through the amplifier stage as a gain control parameter. This limits the high frequency operating range of the amplifier as the gain is varied. The Improved AGC Amplifier of FIG. 3 achieves gain control through current steering and uses constant emitter degeneration to provide linearity. As with the previous example, this amplifier lacks high frequency operating characteristics. Thus, a variable gain amplifier providing gain control functionalities at high frequencies while operating on linear signals would be greatly desirable.

SUMMARY OF THE INVENTION

The present invention overcomes the foregoing and other problems with a variable gain amplifier providing linear operating characteristics at high frequencies. The apparatus includes a differential amplifier transistor pair for providing an output voltage in response to an input voltage. A diode pair is connected between the emitters of the transistor pair to provide gain control of the amplifier using emitter degeneration. Gain control is achieved by controlling the impedance of the diode pair by varying the current flow through them using transistor circuitry having a control voltage applied thereto.

The non-linear characteristics of the diode pair between the emitters of the transistor pair are controlled by input diodes which perform a predistortion function on the diode pair to limit distortion of the output voltage due to non-linear characteristics of the diode pair. Finally, a dummy amplifier is connected to the differential amplifier transistor pair to cancel the capacitive effects generated by the diode pair in order to increase the gain control range of the amplifier at higher frequencies.

BRIEF DESCRIPTION OF THE DRAWINGS

For a more complete understanding of the present invention, reference is made to the following detailed description taken in conjunction with the accompanying drawings wherein.

DETAILED DESCRIPTION OF THE INVENTION

Figure 1:
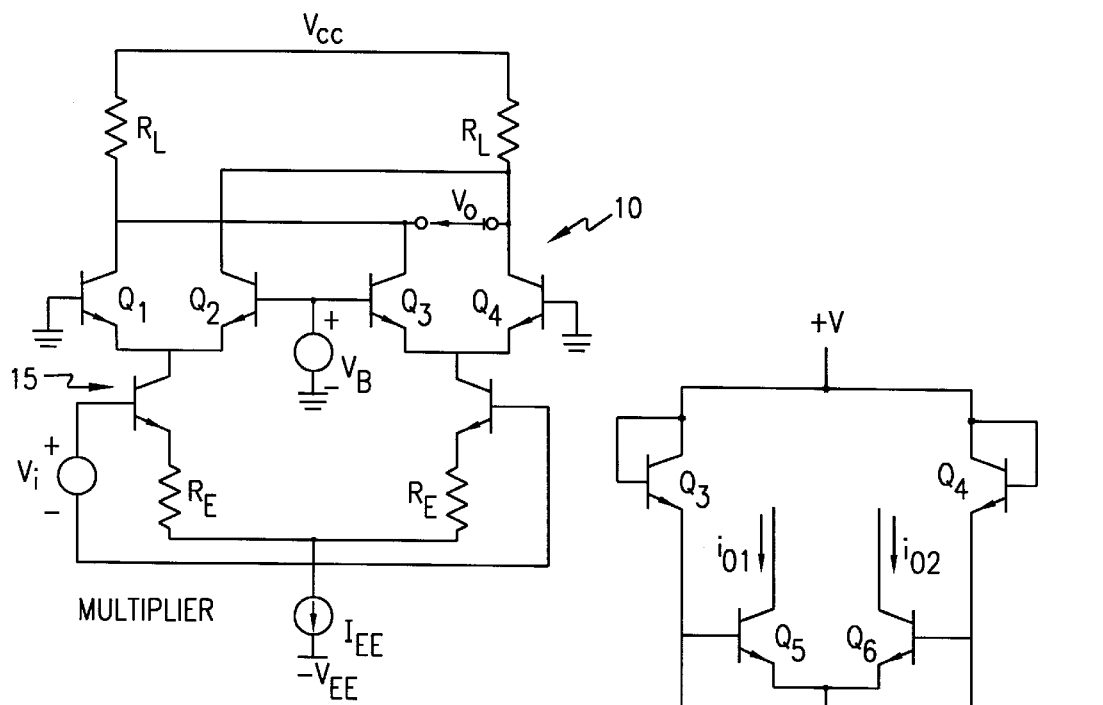
FIG. 1 is a schematic drawing of a Gilbert Cell Multiplier.
Figure 2:
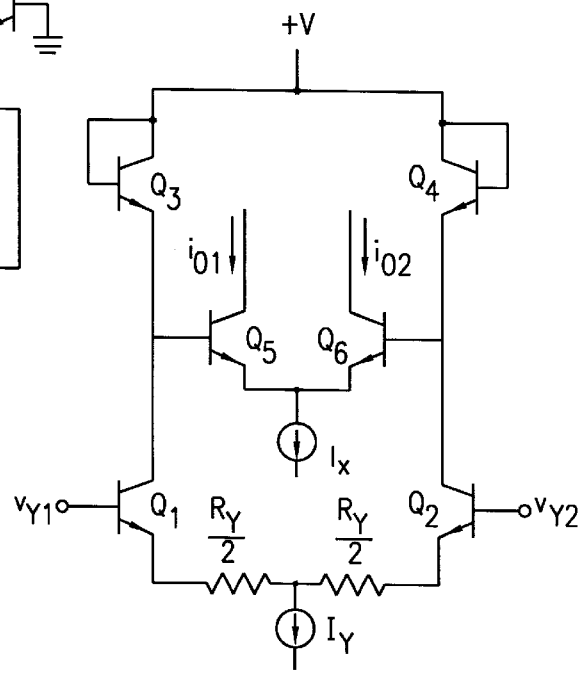
FIG. 2 is a schematic diagram of a two Quadrant Multiplier.
Figure 3:
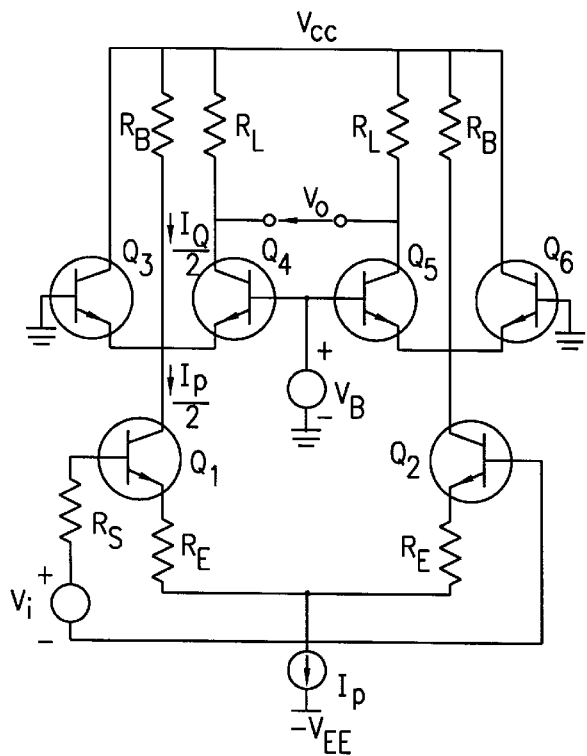
FIG. 3 is a schematic diagram of an Improved AGC Amplifier.
Figure 4:
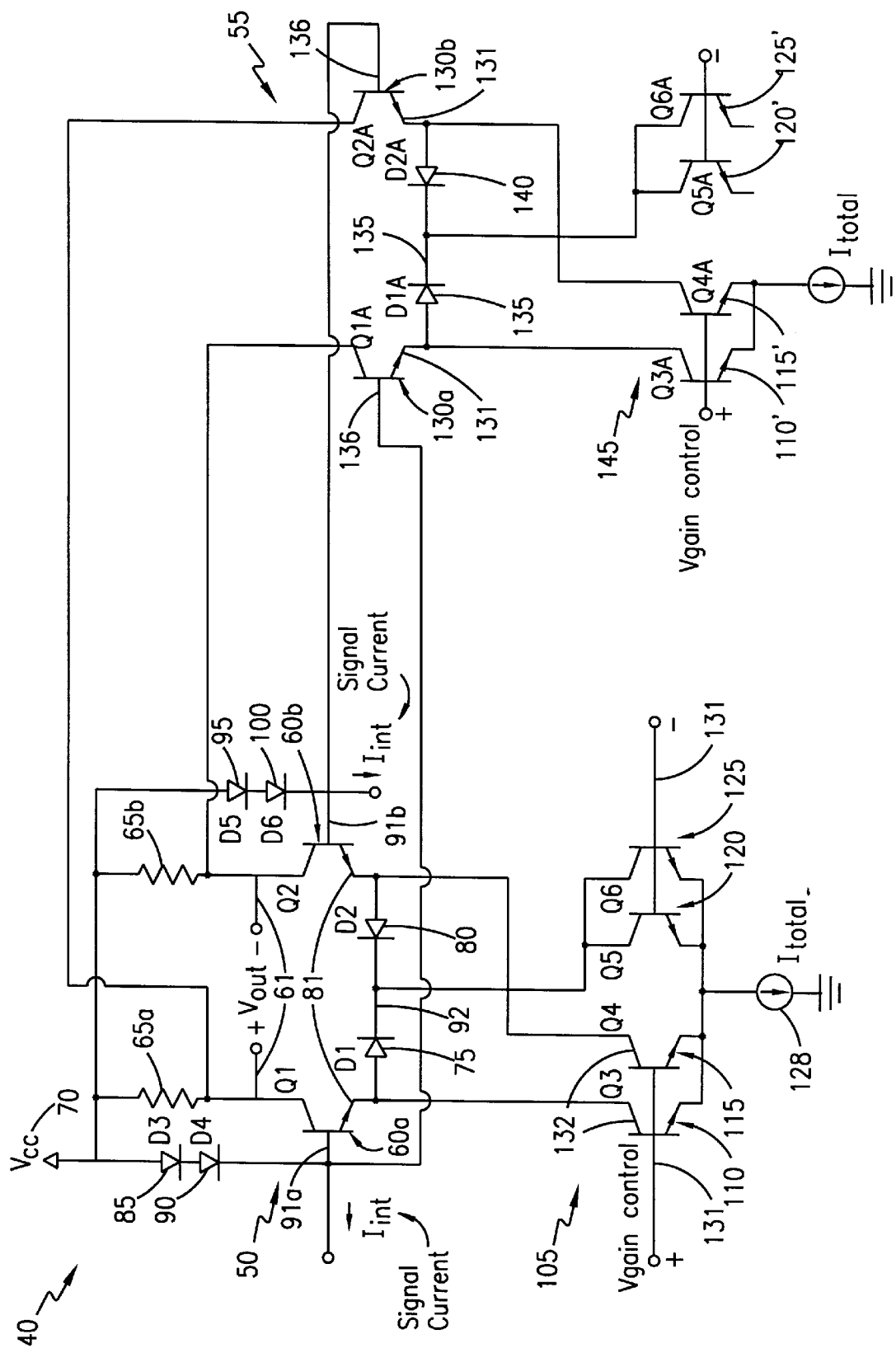
FIG. 4 is a schematic diagram of a linear, high frequency, variable gain amplifier of the present invention.

Referring now to FIG. 4, there is illustrated the amplifier circuitry 40 of the present invention. The amplifier circuitry 40 consists of a main differential amplifier circuitry 50 and a dummy differential amplifier circuitry 55. The first differential amplifier circuitry 50 consists of an amplifier 60 pair comprising first and second bipolar junction transistors (BJTS) 60a and 60b. In the preferred embodiment, the transistors comprise NPN transistors making the amplifier suitable for inexpensive IC (integrated circuit) fabrication processes. The collectors 61 of the BJTs 60a and 60b are connected to system power ($V_{CC}$) 70 through load resistors 65a and 65b. A pair of diodes 75 and 80 are connected between the emitters 81 of transistors 60a and 60b to facilitate gain control. The diodes 75 and 80 provide the gain control due to variable emitter degeneration (variable as a function of their bias current) of the differential amplifier pair 60.

Normally, this configuration of diodes would lead to signal distortion due to the non-linear I/V characteristics of the diodes. The distortion affect is minimized using four input diodes 85, 90, 95 and 100. A first diode pair including the diodes 85 and 90 is connected between $V_{CC}$ (or any suitable dc voltage) 70 and the base 91a of transistor 60a of the differential amplifier pair 60. The second diode pair including the diodes 95 and 100 is connected between $V_{CC}$ (or any suitable dc voltage) 70 and the base 91b of transistor 60b of the differential amplifier pair 60. The input diodes 85, 90, 95 and 100 perform a predistortion function on the differential input signal current such that the output voltage of the differential amplifier pair 60 remains linear. Thus, signal distortion due to non-linear I/V characteristics is substantially eliminated.

The gain is controlled by splitting the main DC current between degeneration diodes 75 and 80 and the amplifier pair 60 using gain control circuitry 105. The gain control circuitry 105 consists of four transistors 110, 115, 120 and 125 connected to the emitters 81 of the transistors 60a and 60b and the anodes 92 of diodes 75 and 80. The emitters 126 of the transistors 110–125 are connected to current source 128. The gain control voltage is connected across the base inputs 131 of a first transistor pair 110 and 115 and a second transistor pair 120 and 125. The collectors 132 of transistors 110 and 115 are connected to the emitters 81 of transistors 60a and 60b, respectively. The collectors of transistors 120 and 125 are tied together and connected to the anodes 92 of diodes 75 and 80. The diode current through diodes 75 and 80 controls the impedance of the diodes 75 and 80 and modulates the signal gain in pair 60. The total current passing through differential amplifier pair 60 remains constant to insure the frequency response remains flat (linear) as the gain is varied by the gain control voltage.

A configuration including only the first amplifier circuitry 50 would normally be limited at very high frequencies (e.g., 1 GHz) to 20 or 25 dB gain control range. This is because at a minimum gain setting, the capacitance of diodes 75 and 80 provides an unwanted shunt capacitance between the emitters 81 of transistors 60a and 60b. This effectively limits the lowest achievable gain of the differential amplifier pair 60. This problem increases if the circuit has been designed for low noise operation. Since a low noise design implies the use of large devices for transistors 60a and 60b and for diodes 75 and 80, an even larger shunt capacitance is generated by diodes 75 and 80.

The present invention utilizes dummy differential amplifier circuitry 55, which is biased for minimum gain and driven by the same input as the main amplifier, to cancel the effects of the shunt capacitance. The collectors 129 of the dummy differential amplifier pair 130 are crossed and added to the original output. This reproduces the unwanted signal leakage and adds it to the output at reverse polarity, thus providing cancellation of the capacitive effects of diodes 75 and 80 and restoring much of the lost gain control range. The base inputs 136 of transistors 130a and 130b are connected to the base inputs 91 of transistors 60a and 60b. Diodes 135 and 140 are connected between the emitters 131 of transistors 130a and 130b. The gain control circuitry 145 of the dummy amplifier circuitry 55 is configured in the same manner as the gain control circuitry 105 of the main amplifier except that the emitters of transistor 130a and 130b are left unconnected to maintain diodes 135 and 140 at a minimum current condition. Similar numbers are used to identify similar components.

The disclosed invention provides an apparatus to perform gain control functions at high frequencies while operating on linear signals. The apparatus would be applicable to transmitter and/or receiver technologies in portable, mobile and base station equipment when more than 25 dB of power control is desired. The fact that gain control is possible at high frequencies in the 100 MHz and higher range makes this invention applicable to 0-IF upconversion/downconversion as well.

Although a preferred embodiment of the method and apparatus of the present invention has been illustrated in the accompanying Drawings and described in the foregoing Detailed Description, it is understood that the invention is not limited to the embodiment disclosed, but is capable of numerous rearrangements, modifications, and substitutions without departing from the spirit of the invention as set forth and defined by the following claims.

What is claimed is:

1. A variable gain amplifier, comprising:
    a differential amplifier transistor pair for providing an output signal in response to an input signal;
    a first diode pair connected between emitters of the differential amplifier transistor pair;
    a second diode pair connected in series between a dc bias voltage and a base of a first transistor of the differential amplifier transistor pair for performing a predistortion function to limit distortion of the output signal due to non-linear characteristics of the first diode pair;
    a third diode pair connected in series between the dc bias voltage and a base of a second transistor of the differential amplifier transmitter pair for performing a predistortion function to limit distortion of the output signal due to non-linear characteristics of the first diode pair; and
    transistor circuitry responsive to application of a voltage control signal for controlling an impedance of the first diode pair by controlling the current flow through the first diode pair.

2. The amplifier of claim 1 wherein the transistor circuitry modulates the current flow through the first diode pair while maintaining at a constant level a total current flow in the differential amplifier transistor pair.

3. The amplifier of claim 1 further including means for canceling capacitive effects of the first diode pair to increase a gain control range of the amplifier to frequencies of at least 100 MHz.

4. The amplifier of claim 3 wherein the means for canceling comprises a dummy amplifier biased for minimum gain and driven by the input signal, the dummy amplifier further including cross-coupled collectors connected to the output signal.

5. A variable gain amplifier, comprising:
    a differential amplifier transistor pair for providing an output voltage in response to an input voltage;
    a first diode pair connected between emitters of the differential amplifier transistor pair to control a gain of the output voltage of the amplifier;
    a second diode pair connected in series between a dc bias voltage and a base of a first transistor of the differential amplifier transistor pair for performing a predistortion function to limit distortion of the output signal due to non-linear characteristics of the first diode pair;
    a third diode pair connected in series between the dc bias voltage and a base of a second transistor of the differential amplifier transmitter pair for performing a predistortion function to limit distortion of the output signal due to non-linear characteristics of the first diode pair; and
    means for controlling a current flow through the diode pair to maintain a constant current flow through the differential amplifier transistor pair in response to a voltage control signal.

6. The amplifier of claim 5 wherein the transistor pair comprises NPN transistors.

7. A variable gain amplifier, comprising:
    a differential amplifier transistor pair for providing an output signal in response to an input signal;
    a first diode pair connected between emitters of the transistor pair;
    a dummy amplifier biased for minimum gain and driven by the input signal for canceling the capacitive effects of the diode pair to increase a gain control range of the amplifier the dummy amplifier further including cross-coupled collectors added to the output signal;
    transistor circuitry responsive to application of a control signal for controlling a gain of the amplifier by controlling an impedance of the diode pair.

8. The amplifier of claim 7 further including means for performing a predistortion function on the diode pair to limit distortion of the output signal due to nonlinear characteristics of the diode pair.

9. The amplifier of claim 8 wherein the means for performing comprises:
    a second diode pair connected between a dc bias voltage and a base of a first transistor of the differential amplifier transistor pair; and
    a third diode pair connected between the dc bias voltage and a base of a second transistor of the differential amplifier transmitter pair.

10. The amplifier of claim 7 wherein the means for canceling comprises a dummy amplifier biased for minimum gain and driven by the input signal, the dummy amplifier further including cross-coupled collectors added to the output signal.

11. The amplifier of claim 7 wherein the transistor pair comprises NPN transistors.

12. A variable gain amplifier, comprising:

a differential amplifier transistor pair for providing an output signal in response to an input signal;

a diode pair connected between emitters of the transistor pair;

means for performing a predistortion function on the diode pair to limit distortion of the output signal due to nonlinear characteristics of the diode pair;

transistor circuitry responsive to application of a control signal for controlling a gain of the output signal of the amplifier by controlling an impedance of the diode pair by varying the current flow therethrough; and a dummy amplifier biased for minimum gain and driven by the input signal for canceling the capacitive effects of the diode pair to increase a gain control range of the amplifier the dummy amplifier further including cross-coupled collectors added to the output signal.

13. The amplifier of claim 12 wherein the means for performing comprises:

a first diode pair connected between a dc bias voltage and a base of a first transistor of the differential amplifier transistor pair; and a second diode pair connected between the dc bias voltage and a base of a second transistor of the differential amplifier transmitter pair.

14. The amplifier of claim 12 wherein the transistor pair comprises NPN transistors.

* * * * *

UNITED STATES PATENT AND TRADEMARK OFFICE
CERTIFICATE OF CORRECTION

PATENT NO. : 5,949,286
DATED : September 7, 1999
INVENTOR(S) : Mark Alan Jones

It is certified that error appears in the above-identified patent and that said Letters Patent is hereby corrected as shown below:

Column 1,
Before the "Description of Related Art" insert the following:
-- BACKGROUND OF THE INVENTION
Technical Field of the Invention
The present invention relates to variable gain amplifiers, and more particularly, to a variable gain amplifier possessing a high degree of linearity and the capability of operating at frequencies of greater than 100MHz. --

Signed and Sealed this

Eleventh Day of September, 2001

*Attest:*

*Attesting Officer*

NICHOLAS P. GODICI
*Acting Director of the United States Patent and Trademark Office*